US010719754B2

(12) United States Patent
Launay et al.

(10) Patent No.: US 10,719,754 B2
(45) Date of Patent: Jul. 21, 2020

(54) ELECTRONIC DOCUMENT HAVING AN ELECTRICAL CONNECTION BETWEEN A CHIP PORT AND AN EXTERNAL ELECTRICAL CONNECTION LAND THAT IS ESTABLISHED VIA AN INLAY

(71) Applicant: IDEMIA France, Courbevoie (FR)

(72) Inventors: François Launay, Courbevoie (FR); Mickaël Huet, Courbevoie (FR)

(73) Assignee: IDEMIA FRANCE, Courbevole (FR)

( * ) Notice: Subject to any disclaimer, the term of this patent is extended or adjusted under 35 U.S.C. 154(b) by 0 days.

(21) Appl. No.: 16/373,077

(22) Filed: Apr. 2, 2019

(65) Prior Publication Data

US 2019/0303738 A1    Oct. 3, 2019

(30) Foreign Application Priority Data

Apr. 3, 2018    (FR) .................................... 18 52867

(51) Int. Cl.
| | | |
|---|---|---|
| *G06K 19/077* | (2006.01) | |
| *H01Q 1/22* | (2006.01) | |
| *H05K 1/11* | (2006.01) | |
| *H05K 1/18* | (2006.01) | |
| *H01Q 1/36* | (2006.01) | |

(52) U.S. Cl.
CPC .   *G06K 19/07745* (2013.01); *G06K 19/07747* (2013.01); *G06K 19/07754* (2013.01); *G06K 19/07769* (2013.01); *H01Q 1/22* (2013.01); *H01Q 1/36* (2013.01); *H05K 1/111* (2013.01); *H05K 1/115* (2013.01); *H05K 1/181* (2013.01)

(58) Field of Classification Search
CPC .......... H01Q 1/36; H01Q 1/22; H01Q 1/2216; G06K 19/07745; G06K 19/07769; G06K 19/07754; G06K 19/07747; G06K 19/07749; H05K 1/111; H05K 1/181; H05K 1/115
See application file for complete search history.

(56) References Cited

U.S. PATENT DOCUMENTS

| | | | |
|---|---|---|---|
| 7,243,854 B2 | 7/2007 | Launay | |
| 2007/0271467 A1* | 11/2007 | Ayala | G06K 19/07749 713/185 |

(Continued)

FOREIGN PATENT DOCUMENTS

| | | |
|---|---|---|
| EP | 2178032 A1 | 4/2010 |
| EP | 2722795 A1 | 4/2014 |

(Continued)

OTHER PUBLICATIONS

French Search Report, dated Feb. 15, 2019, from corresponding FR application No. 18 52867.

*Primary Examiner* — Dameon E Levi
*Assistant Examiner* — David E Lotter
(74) *Attorney, Agent, or Firm* — Young & Thompson

(57) ABSTRACT

Disclosed is an electronic document, a body of which includes an inlay, a part of which forms a spotface of a cavity, and which includes a connection land formed on the part forming the spotface, and a module of which includes an electrical circuit that includes both a first subcircuit configured to electrically connect a port of a chip to the connection land and a second subcircuit configured to electrically connect the connection land to an external electrical contact land of a carrier of the module.

20 Claims, 13 Drawing Sheets

(56) References Cited

U.S. PATENT DOCUMENTS

| | | | |
|---|---|---|---|
| 2010/0200661 A1* | 8/2010 | Shafran | G06K 19/07773 235/492 |
| 2015/0090799 A1* | 4/2015 | Zhang | G06K 19/0723 235/492 |
| 2015/0161501 A1* | 6/2015 | Krull | G06K 19/07745 361/764 |
| 2016/0224882 A1* | 8/2016 | Zhang | G06K 19/07754 |
| 2017/0092612 A1 | 3/2017 | Zenz | |

FOREIGN PATENT DOCUMENTS

| | | |
|---|---|---|
| EP | 3151167 A1 | 4/2014 |
| FR | 2857483 A1 | 1/2005 |
| WO | 2006/005854 A1 | 1/2006 |

\* cited by examiner

ELECTRONIC DOCUMENT HAVING AN ELECTRICAL CONNECTION BETWEEN A CHIP PORT AND AN EXTERNAL ELECTRICAL CONNECTION LAND THAT IS ESTABLISHED VIA AN INLAY

The present application relates to an electronic document.

Such an electronic document includes, for example, a body in which a cavity opening out onto one of the faces of the body is formed, and a module, inserted into the cavity.

The document may be, in particular, a chip card such as a bank card, or an identity document such as, for example, an identity card or a passport.

The cavity of the body possibly includes, in practice, a deep central portion surrounded by a peripheral zone formed of a spotface, i.e. a cavity that is shallow with respect to the thickness of the electronic document, the depth of which is much less deep than that of the central portion, chosen such that the module, once set into the cavity, is flush with the face of the body of the electronic document.

Furthermore, the module generally includes a thin, planar carrier including, on what is referred to as an external face, a plurality of external electrical connection lands that are intended to cooperate through contact with contact zones of an external reader, and, on what is referred to as an internal face, a printed circuit formed of connection tracks and a microcircuit (also referred to as an "integrated circuit" or "chip") that is connected to the external contact lands via the printed circuit. The connection between the terminals of the chip and the printed circuit may be direct (in the case of the terminals of the chip being on the face of the chip facing the carrier), referred to as the "flip-chip" technique, or be achieved by means of connecting wires (in the case of the terminals of the chip being opposite the carrier, which provides more flexibility considering the various geometries of the chips that may be implanted). The printed circuit is typically connected to the external electrical contact lands by means of wells, i.e. holes in the carrier through which connecting wires, or metallized vias, are routed, i.e. by means of holes passing all the way through the thickness of the carrier and having metallized walls for the purpose of establishing an electrical connection between the metallized zones located on either side of the carrier at the site of the via in question. In practice, the printed circuit includes metallized zones located close to its periphery that are connected to the chip.

Additionally, in some documents, for example what are referred to as "dual-interface" cards allowing both contact and contactless operation, the chip is further connected to the ends of an antenna inside the card body, these ends being for example present on the spotface.

During insertion, the chip, which is encapsulated in a resin, is housed in the deep portion of the cavity, while only portions of the printed circuit extend up to the peripheral zone of the internal face of the carrier that is intended to face the spotface of the cavity. In the aforementioned example, dedicated zones of the printed circuit and the ends of the antenna are then arranged such that, during insertion, they are facing so as to ensure a good electrical connection between the antenna and the chip.

For security reasons, it is advantageous to be able to render a module inoperative as soon as it is separated from the rest of the document.

Document FR 2 857 483 describes for example a chip card within which the electrical connections of the module are formed such that they better mask an active surface of the chip with a view to hindering, or even preventing, optical analysis of the chip; visually clearing the active surface then results in the tracks being destroyed, rendering the chip inoperative.

The object of the present invention is to provide an electronic document in which the module stops working, becomes inoperative, if it is separated from the body of the electronic document, and further affording other advantages.

To this end, what is proposed, according to a first aspect, is an electronic document including:

a body, which includes a cavity hollowed out of part of a thickness of the body, the cavity including a deep central portion and a peripheral portion formed of a spotface, which peripheral portion is less deep than the central portion and surrounds the central portion;
 a module, inserted into the cavity, including:
  a carrier having what is referred to as an external face, which bears at least one external electrical contact land, and what is referred to as an internal face, opposite the external face; and
  a chip, attached on the internal face side of the carrier, including at least one port; and
 the electronic document being characterized in that:
 the body includes an inlay, a part of which forms the spotface of the cavity, and which includes a connection land formed on the part forming the spotface;
 and in that the module includes an electrical circuit that includes both a first subcircuit configured to electrically connect the port of the chip to the connection land of the inlay and a second subcircuit configured to electrically connect the connection land of the inlay to the external electrical contact land of the carrier of the module.

Thus, in such an electronic document, although the module is initially rigidly connected to the body, if the module is separated from the body, the electrical connection between the chip and at least one of the external electrical contact lands is broken, rendering the module inoperative.

Instead of having a printed circuit directly connecting a port of the chip to an external electrical contact land, within the module, the document includes a circuit that passes into the body. There is therefore a first subcircuit, then a circuit part in the inlay, then a second subcircuit.

Thus, the module stops working, becomes inoperative, if it is separated from the body of the electronic document by virtue of the connection between one or more ports of the chip and one or more external electrical contact lands that is made via an inlay inside the structure of the body.

Forming the connection land of the inlay on the spotface-forming part of the inlay makes it likely, for example, that this connection land will be damaged, or even ripped out, if an attempt is made to detach the module from the body.

The term "inlay" refers here to a layer inserted into a thickness of the body of the electronic document.

For example, a width and a length of the inlay is at most equal to a width and a length of the electronic document.

Optionally, the inlay includes a void, preferably a through-void, delimiting the deep central portion of the cavity of the body when the inlay is inserted into a thickness of the body.

For example, the inlay is laminated between at least two other layers forming at least part of the body.

The cavity may then be formed by machining.

The electrical connections between the module and the body, in particular the connection land of the inlay, are for example formed of an anisotropically electrically conductive adhesive material (i.e. a material that is electrically conductive in one direction only, namely generally a direction that is perpendicular to the zones to be connected). Such an anisotropically electrically conductive adhesive includes for example an adhesive matrix and a plurality of conductive particles within the adhesive matrix, providing both a mechanical connection between the module and the body and an electrical connection between the various connection terminals in question.

For example, the module is placed in the cavity according to a connection technique using what is referred to as an ACF (anisotropic conductive film), which deforms under pressure and heat and forms the contact.

The thickness of the body is for example constant, at least five times less than its length and its width.

The cavity is for example rectangular, or even square, in shape, optionally with rounded corners, and opens out onto what is referred to as an upper face of the body. The depths of the cavity extend here in relation to this upper face of the body.

The carrier of the module is for example planar and its thickness (which is defined between its external face and its internal face) is at most equal to the depth of the spotface with respect to the upper face of the body.

It is thus provided with at least one external electrical contact land on its external face and, on its internal face, with the electrical circuit and with the chip.

For example, the first subcircuit and the second subcircuit of the electrical circuit of the module each include a contact pad.

The contact pad of the first subcircuit and the contact pad of the second subcircuit face at least part of the connection land formed on the part of the inlay forming the spotface.

The contact pad of the first subcircuit and the contact pad of the second subcircuit are for example arranged at two distinct sites on the carrier, and located close to the periphery of the carrier.

For example, the contact pad of the first subcircuit and the contact pad of the second subcircuit may be juxtaposed but distinct such that no direct electrical contact is made between them without being connected to the connection land of the inlay.

For example, the second subcircuit includes a via or a well that is electrically connected to a back face of the external electrical connection land of the external face of the carrier, a ring surrounding the via or the well, a track formed in the carrier and the contact pad located facing at least part of the connection land formed on the part of the inlay forming the spotface, the track electrically connecting the ring to the contact pad.

In one exemplary embodiment in which the second subcircuit includes a well, this is for example connected to the ring that surrounds it by a wire, for example a gold wire.

The track of the second subcircuit formed in the carrier is for example etched, photoetched or printed.

For example, the first subcircuit includes at least one wire that is connected to the port of the chip, a track formed in the carrier and the contact pad located facing at least part of the connection land formed on the part of the inlay forming the spotface, the track electrically connecting the wire to the contact pad.

The track of the first subcircuit formed in the carrier is for example etched, photoetched or printed.

According to one advantageous example, the connection land of the inlay consists of a single connection land.

For example, the single land consists of a zigzag of wire or of a metal surface.

The expression "zigzag of wire" refers here to a wire that is for example deposited by forming successive back-and-forth strokes, thus forming rectilinear portions that are connected to one another by turns, forming loops. The rectilinear portions are for example parallel to one another, and two adjacent rectilinear portions are for example connected to one another by a portion that is typically curved, for example in an arc of a circle.

A zigzag of wire makes it possible in particular to cover a larger area so as to form an electrical contact with relatively little material.

The zigzag of wire is for example made of copper.

The metal surface is for example made of copper.

According to another advantageous example, the connection land of the inlay includes a first zone and a second zone that is distinct from the first zone, the first zone being electrically connected to the second zone by a wire formed in the inlay and bypassing the cavity, i.e. bypassing the part of the inlay forming the spot face.

For example, at least one of the first and the second zones consists of a zigzag of wire or of a metal surface.

For example, the zigzag of wire and/or the metal surface are made of copper.

For example, the carrier of the module further includes two antenna pads, which are connected to two corresponding ports of the chip, respectively, and the inlay of the body then includes an antenna that includes two connection lands, each of the two connection lands of the antenna being formed on the part of the inlay forming the spotface and being located facing one of the two antenna pads of the carrier of the module and connected to one of these pads.

The two antenna pads are for example arranged at two distinct sites on the carrier, and located close to the periphery of the carrier.

Such a connection is for example also formed using a, preferably anisotropically, electrically conductive adhesive material, for example as mentioned above.

Preferably, with the exception of its two connection lands, the antenna is formed in the inlay outside its part forming the spotface.

In other words, the antenna is for example formed within the inlay such that its connection lands are located on the part forming the spotface.

The body may also be formed by laminating the inlay between at least two other layers, which are typically made of plastic material.

The cavity may then be formed by machining.

In one exemplary embodiment, the electronic document is a rectangular card and the cavity has an apparent area, corresponding to an outer edge of the spotface for example, that is approximately equal to 8.5 mm 11 mm (millimeters) in size.

Such an electronic document is for example a passport or a card, for example a card in accordance with the current standards, in particular ISO 7810 and ISO 7816, for example a card in ID-1 format (85.60 mm 53.98 mm 0.76 mm), but may also be in other formats, as needed.

Such an electronic document is for example a card, for example a contact or contactless chip card (i.e. a dual-interface card).

The invention, according to one exemplary embodiment, will be clearly understood and its advantages will become more apparent upon reading the following detailed description provided by way of completely nonlimiting indication with reference to the appended drawings, in which:

FIG. 1b shows a view of the bottom, also referred to as the bonding face, of the module of FIG. 1a;

FIG. 2b shows a view of the bottom of the module of FIG. 2a;

Figure 3:
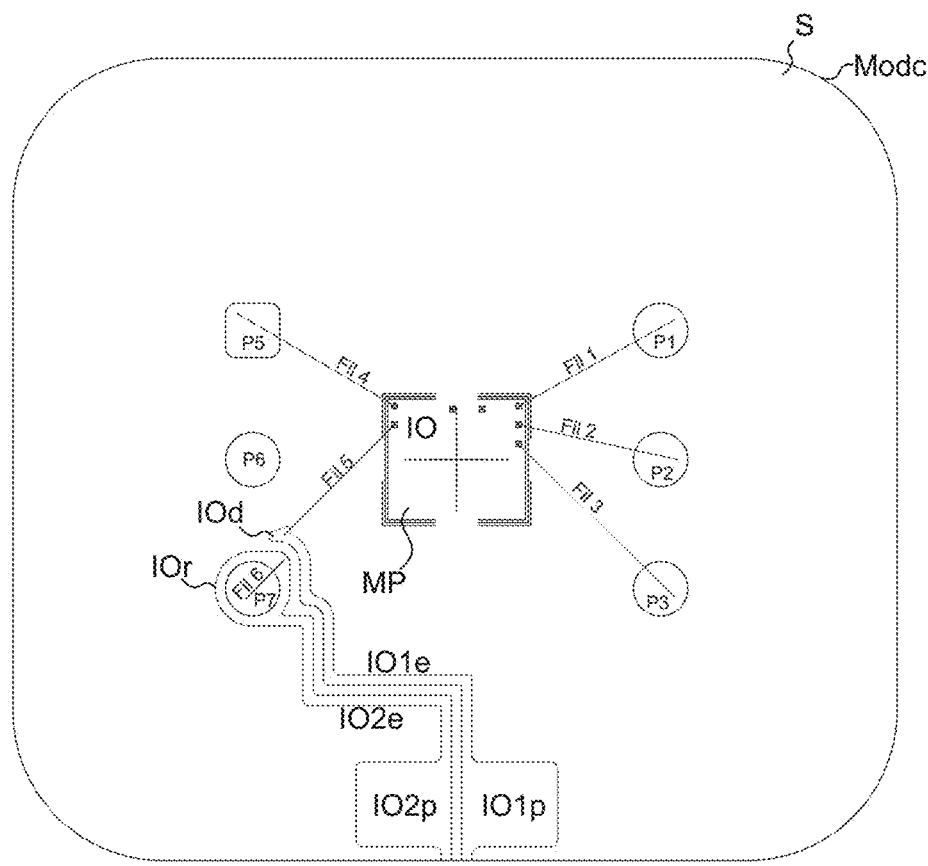
FIGS. 3 to 5 show a module according to exemplary embodiments of the invention for a contact electronic document.
Figure 4:
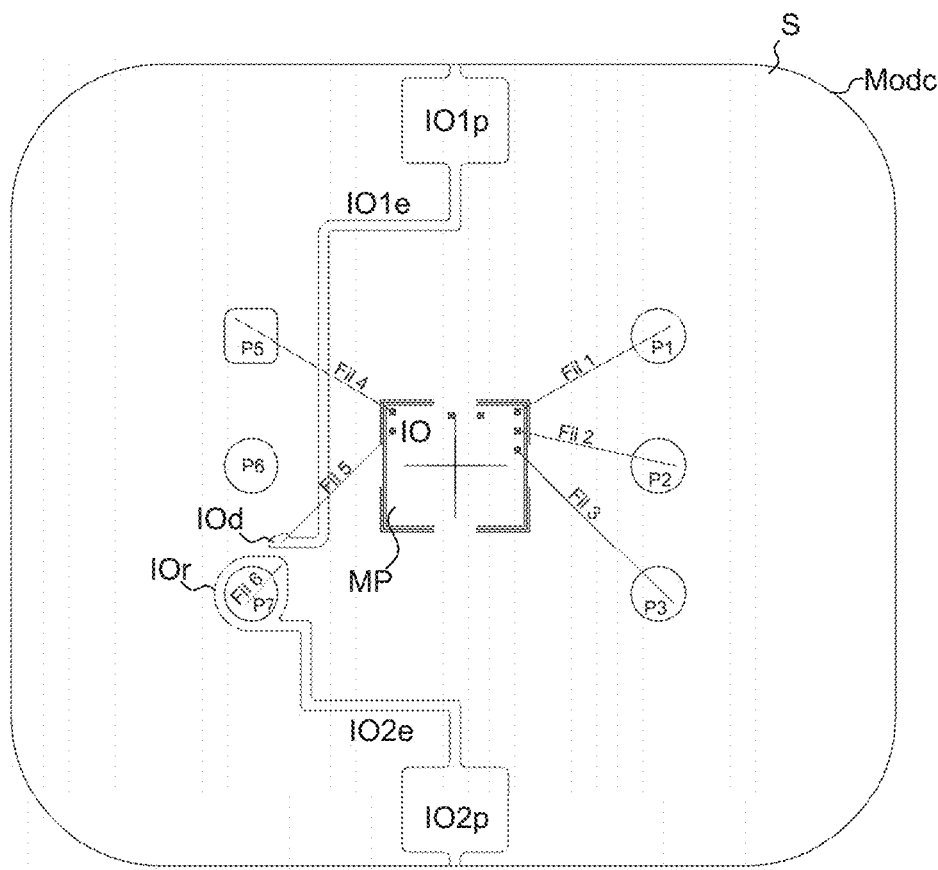
Figure 6:
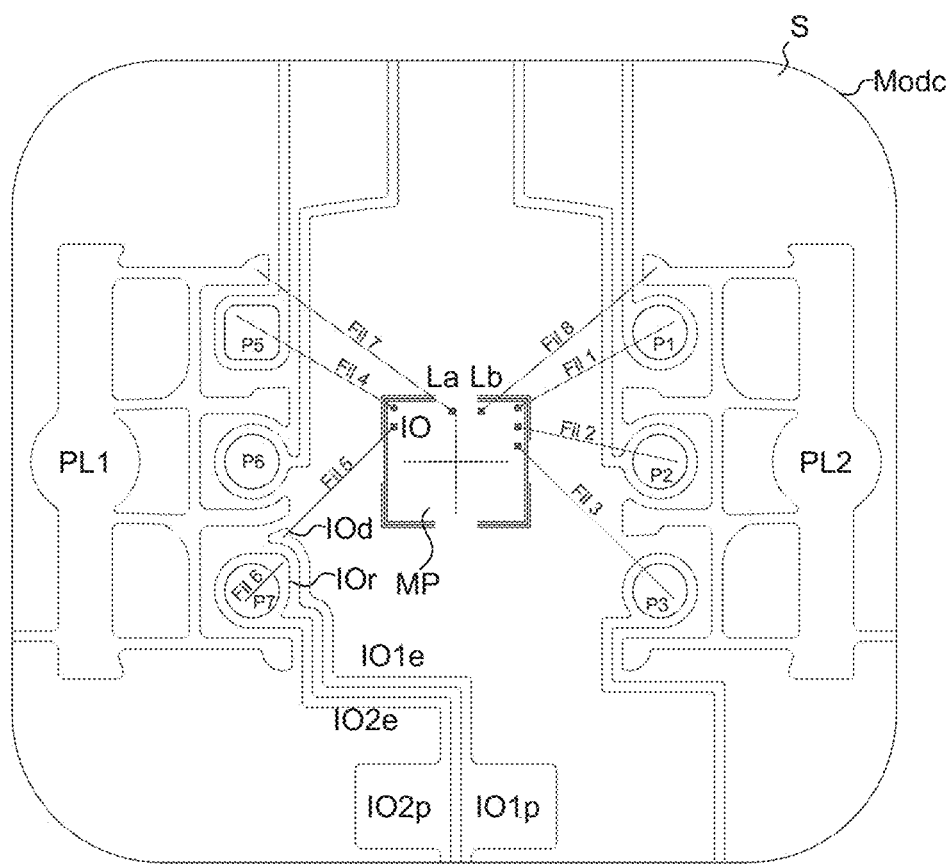
FIGS. 6 to 8 show a module according to exemplary embodiments of the invention for a contact and contactless electronic document.
Figure 7:
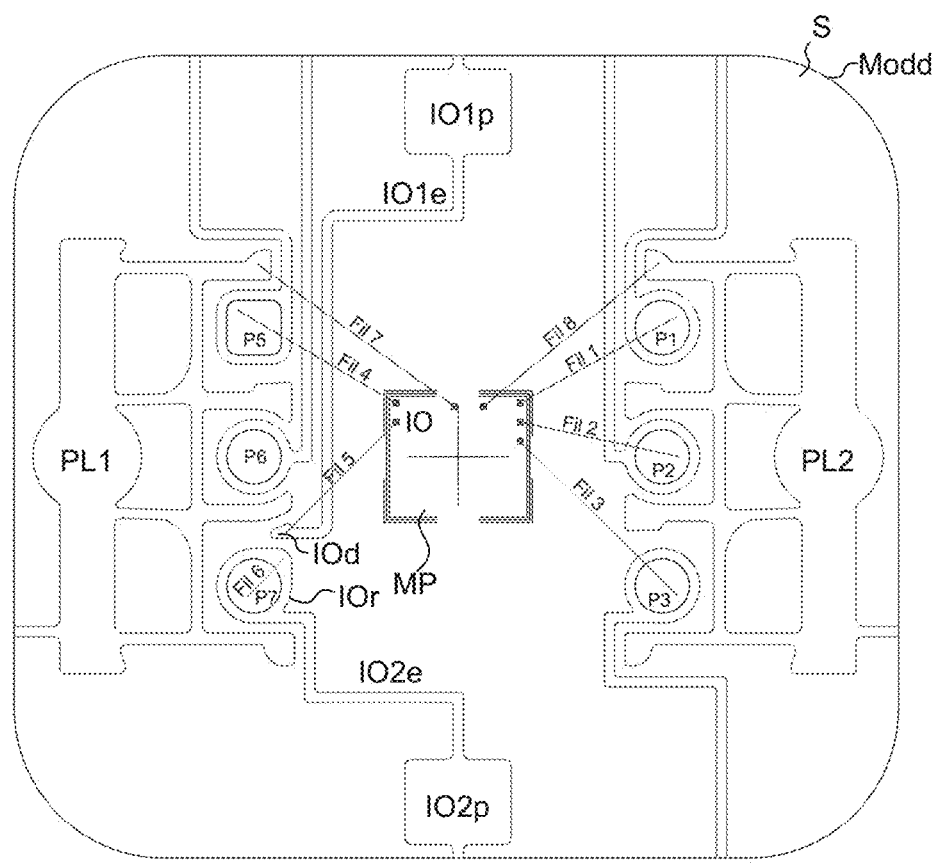
Figure 9:
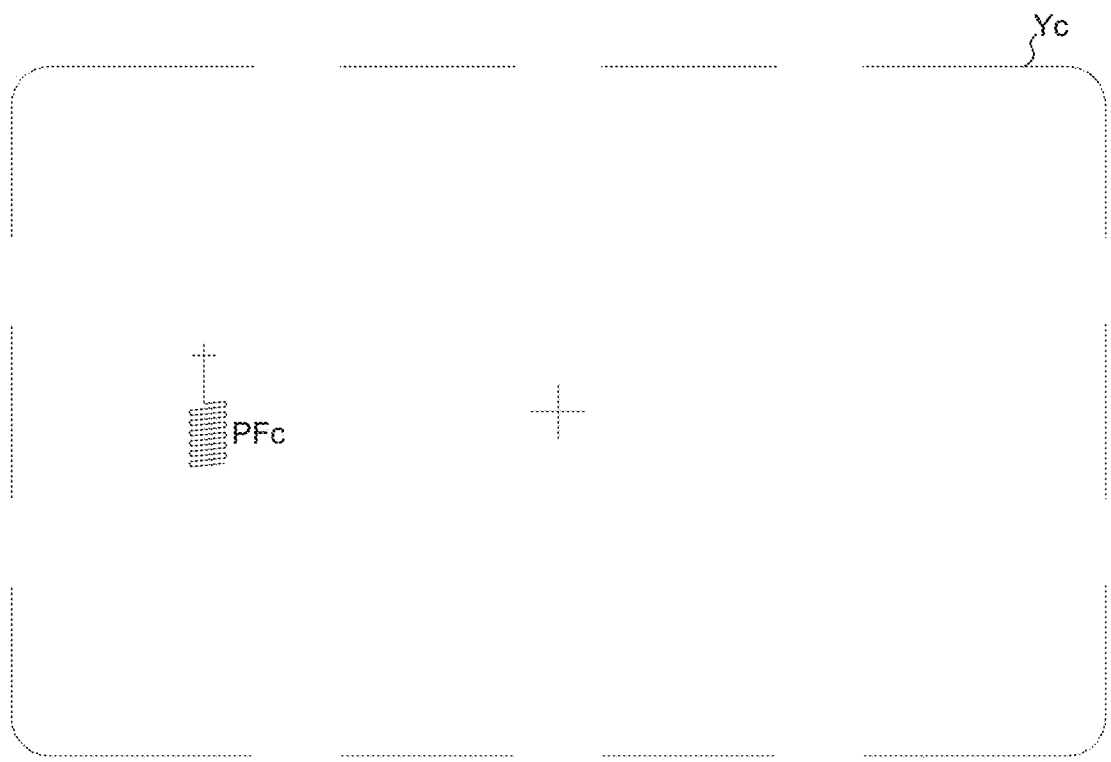
FIGS. 9 to 12 show an inlay according to exemplary embodiments of the invention for a contact electronic document, which includes.
Figure 10:
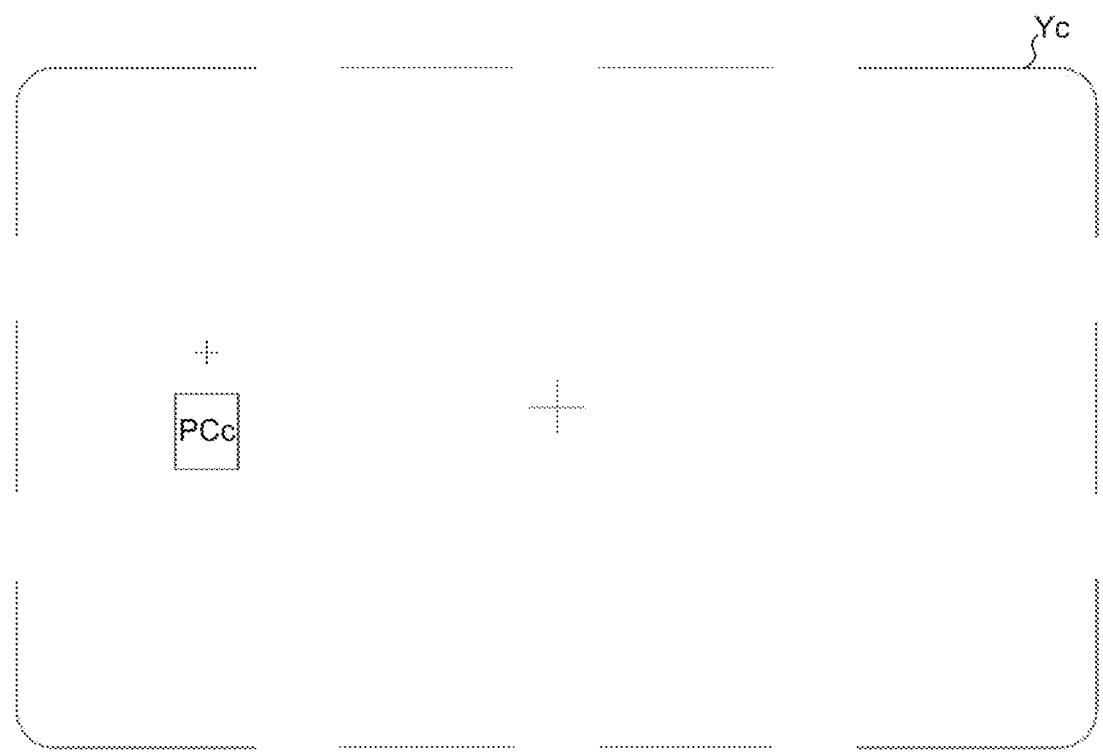
Figure 11:
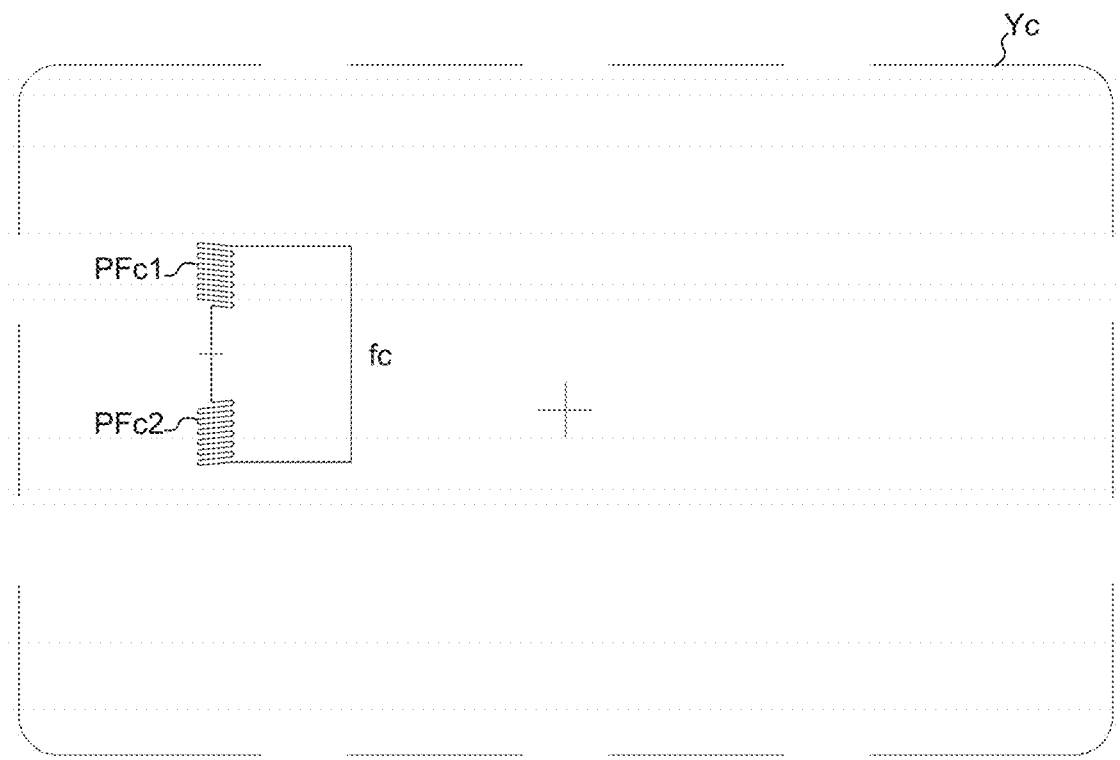
Figure 12:
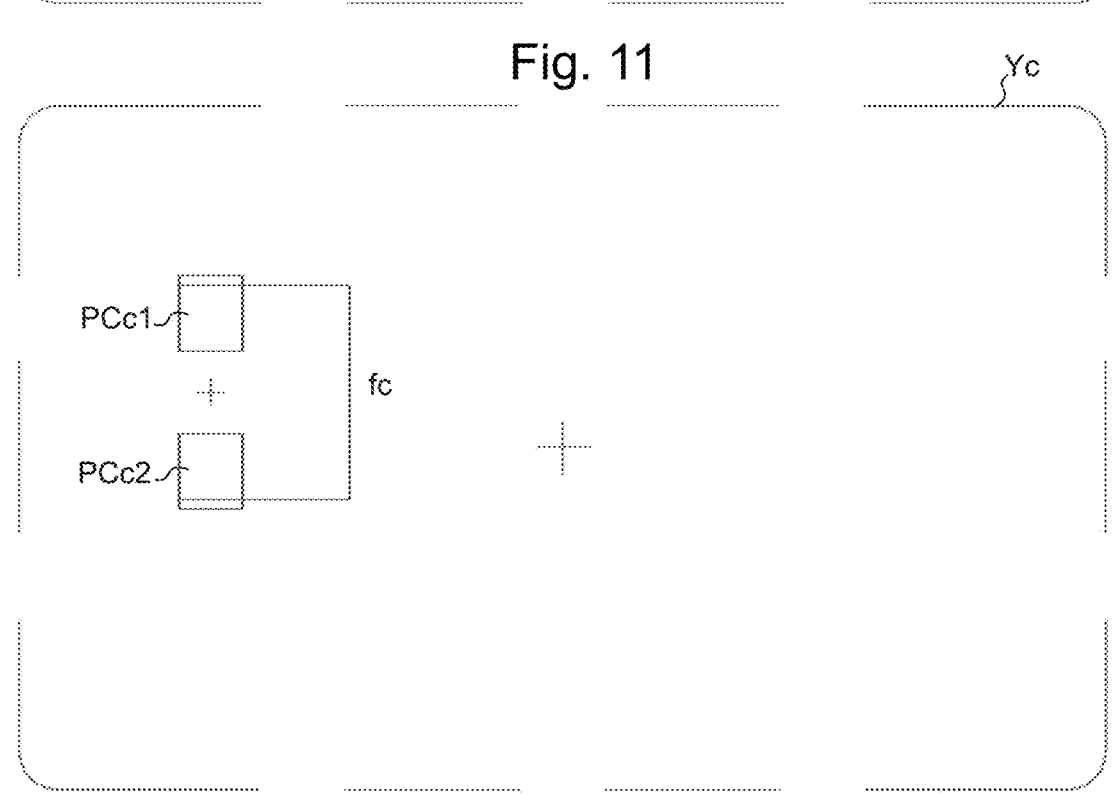
Figure 13:
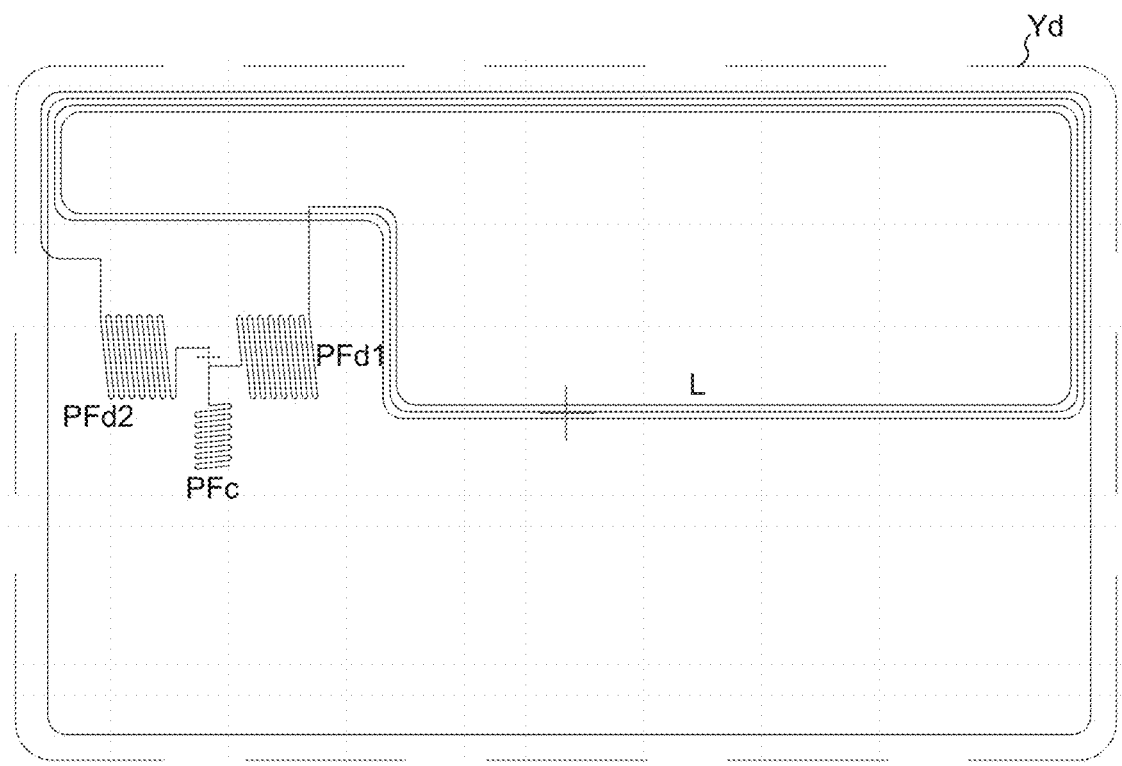
Figure 14:
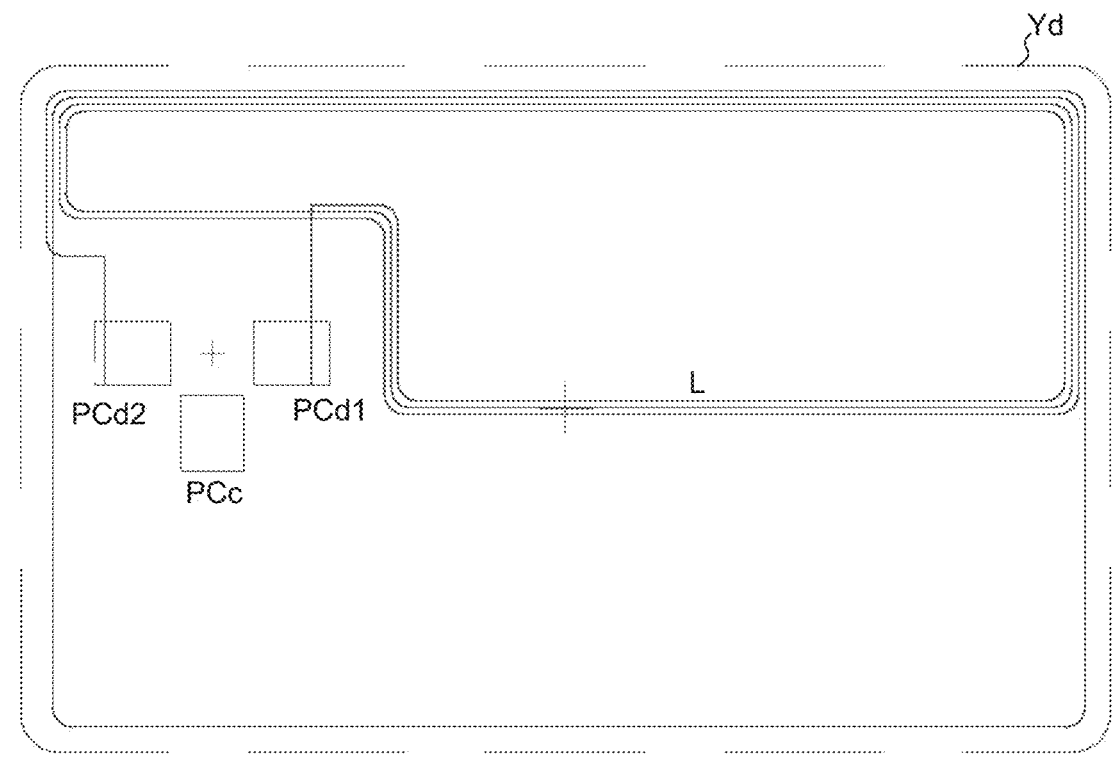
Figure 15:
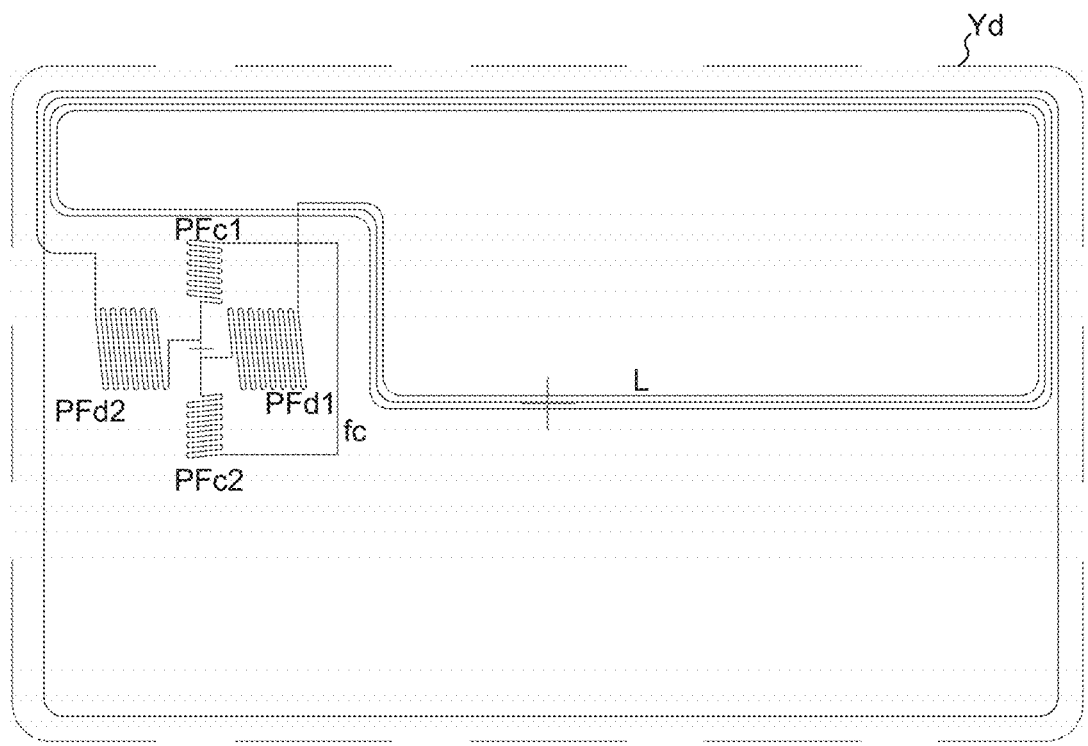
Figure 16:
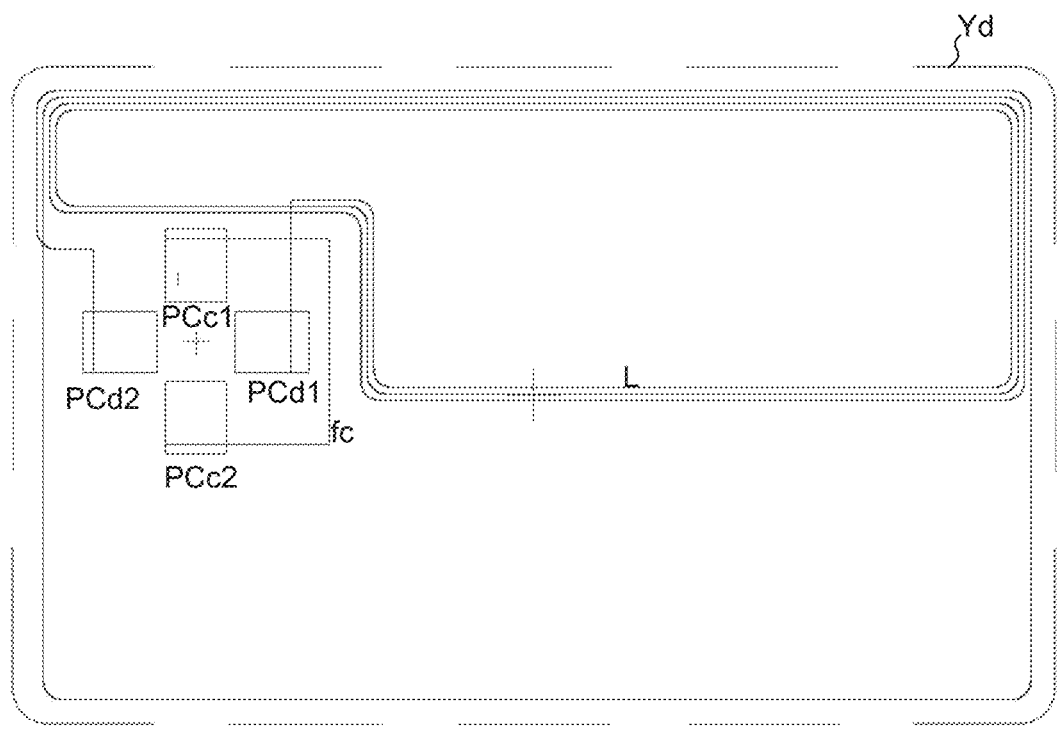
Figure 17:
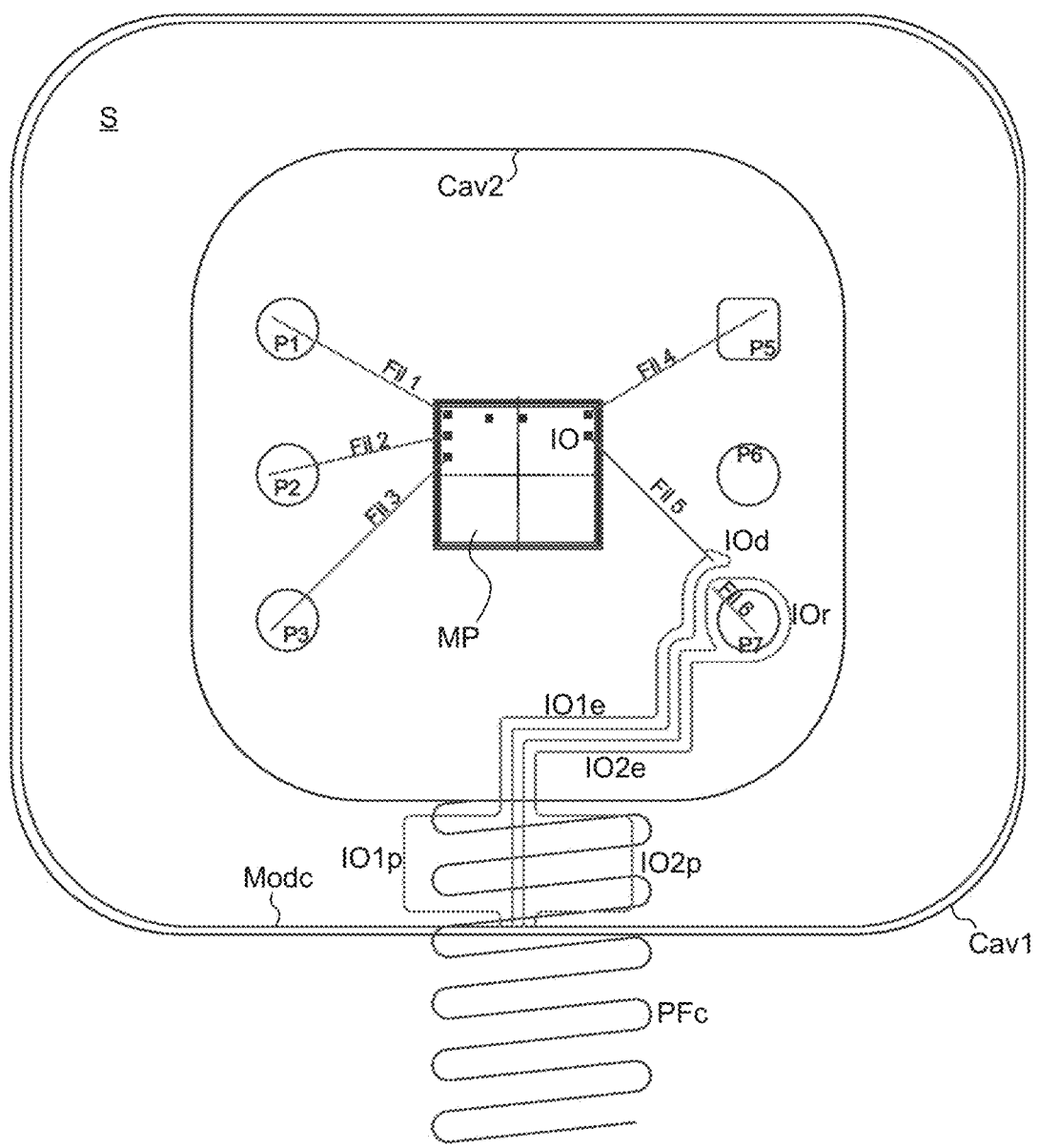
Figure 18:
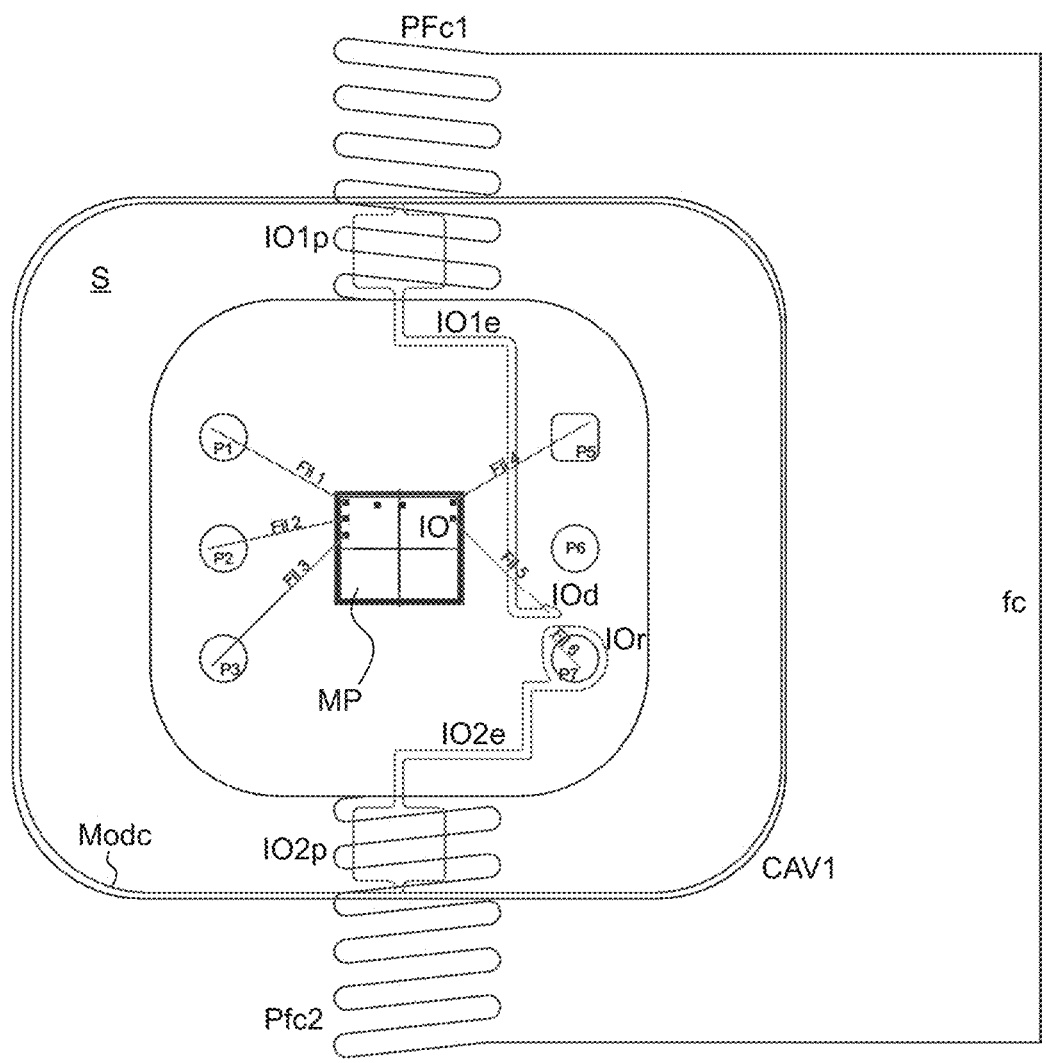
Figure 19:
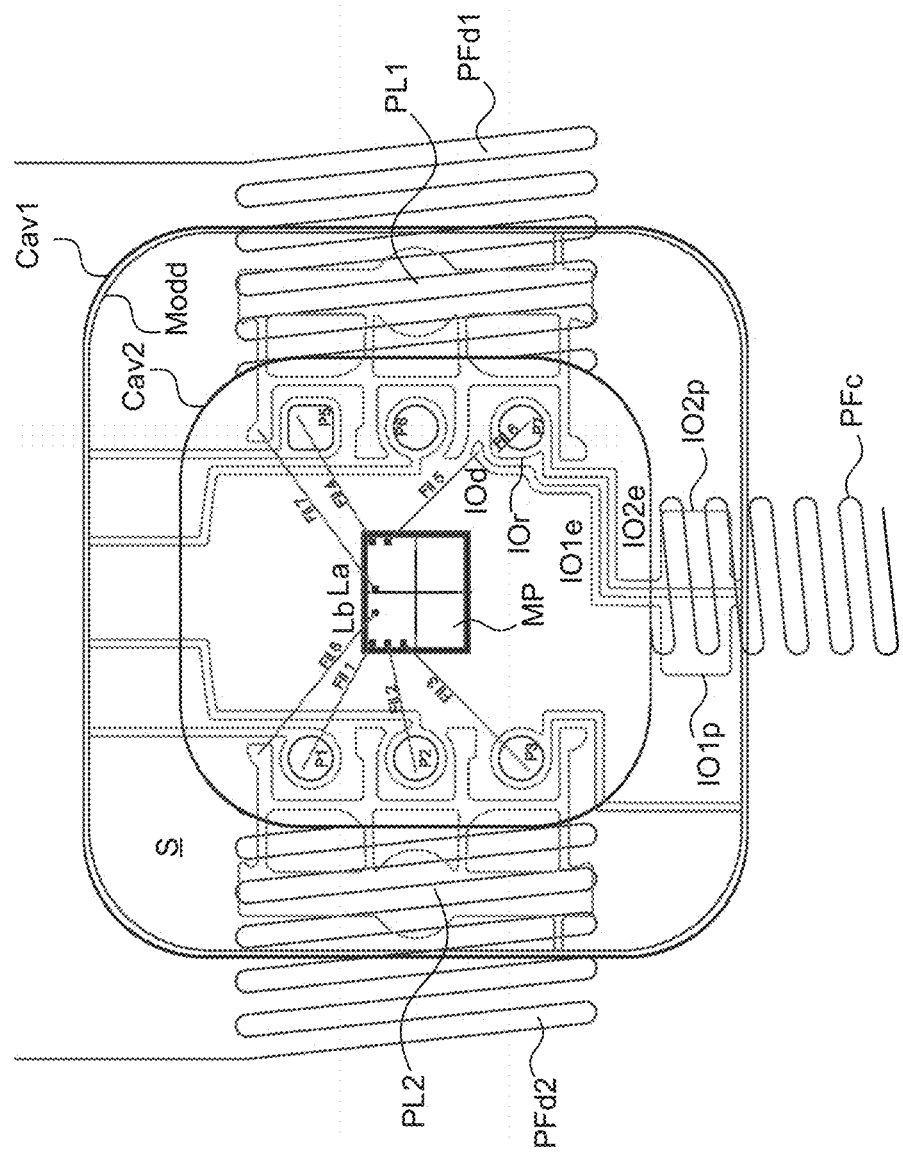
Figure 20:
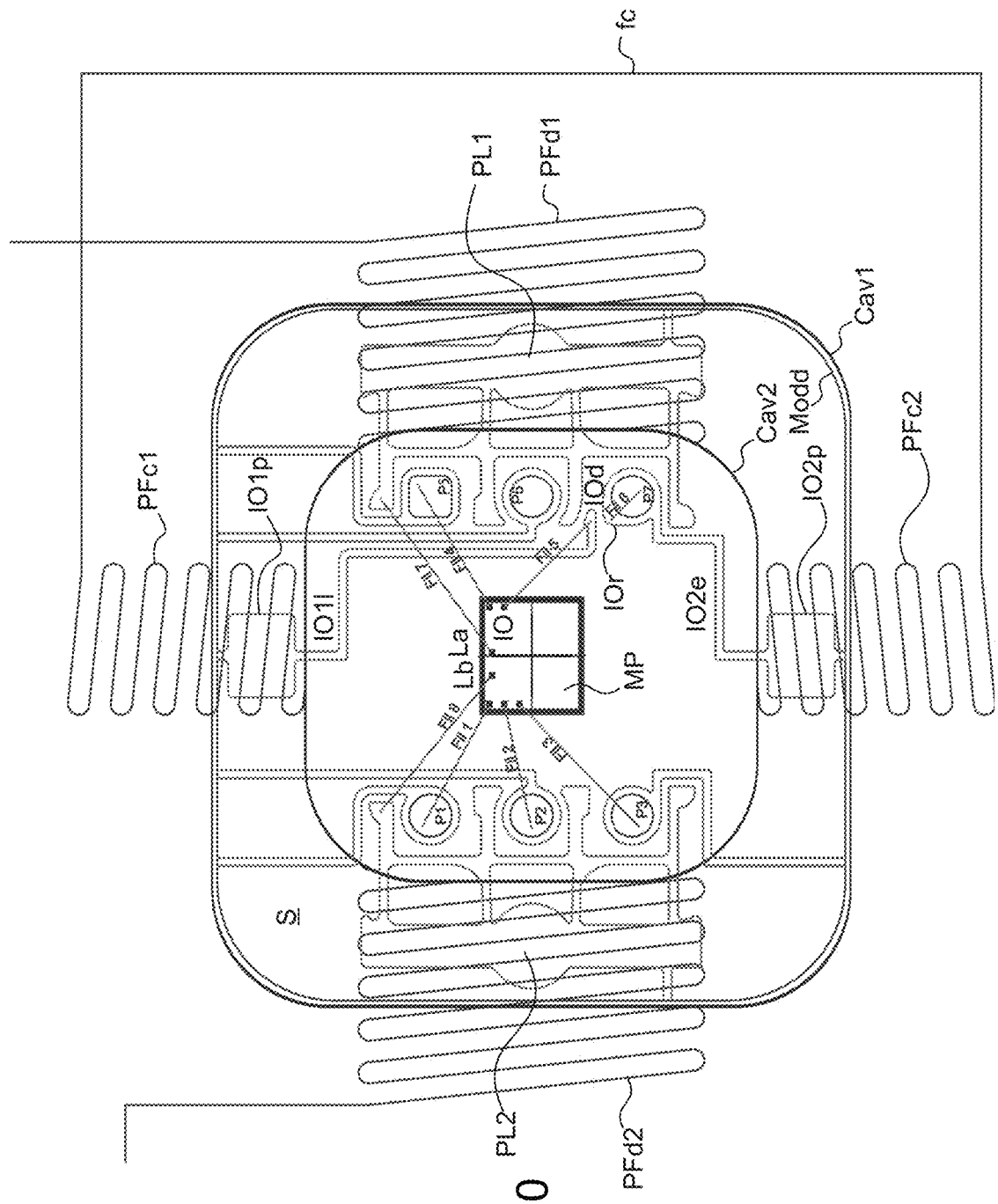

a connection land consisting of a single connection land formed of a zigzag of wire (FIG. 9) or of a metal surface (FIG. 10);

a connection land including a first zone and a second zone that are formed of a zigzag of wire (FIG. 11) or of a metal surface (FIG. 12);

FIGS. 13 to 16 show an inlay according to exemplary embodiments of the invention for a contact and contactless electronic document, which includes:

a connection land consisting of a single connection land formed of a zigzag of wire, and an antenna including two connection lands that are also formed of a zigzag of wire (FIG. 13);

a connection land consisting of a single connection land formed of a metal surface, and an antenna including two connection lands that are also formed of a metal surface (FIG. 14);

a connection land including a first zone and a second zone that are formed of a zigzag of wire, and an antenna including two connection lands that are also formed of a zigzag of wire (FIG. 15);

a connection land including a first zone and a second zone that are formed of a metal surface, and an antenna including two connection lands that are also formed of a metal surface (FIG. 16);

FIG. 17 an example of the connection of the module of FIG. 3 and of the inlay of FIG. 9;

FIG. 18 an example of the connection of the module of FIG. 4 and of the inlay of FIG. 11;

FIG. 19 an example of the connection of the module of FIG. 6 and of the inlay of FIG. 13; and FIG. 20 an example of the connection of the module of FIG. 7 and of the inlay of FIG. 15.

Identical elements shown in the aforementioned figures are identified by the same numerical references.

FIGS. 1a and 1b, and 2a and 2b, show conventional modules.

Figure 1A:
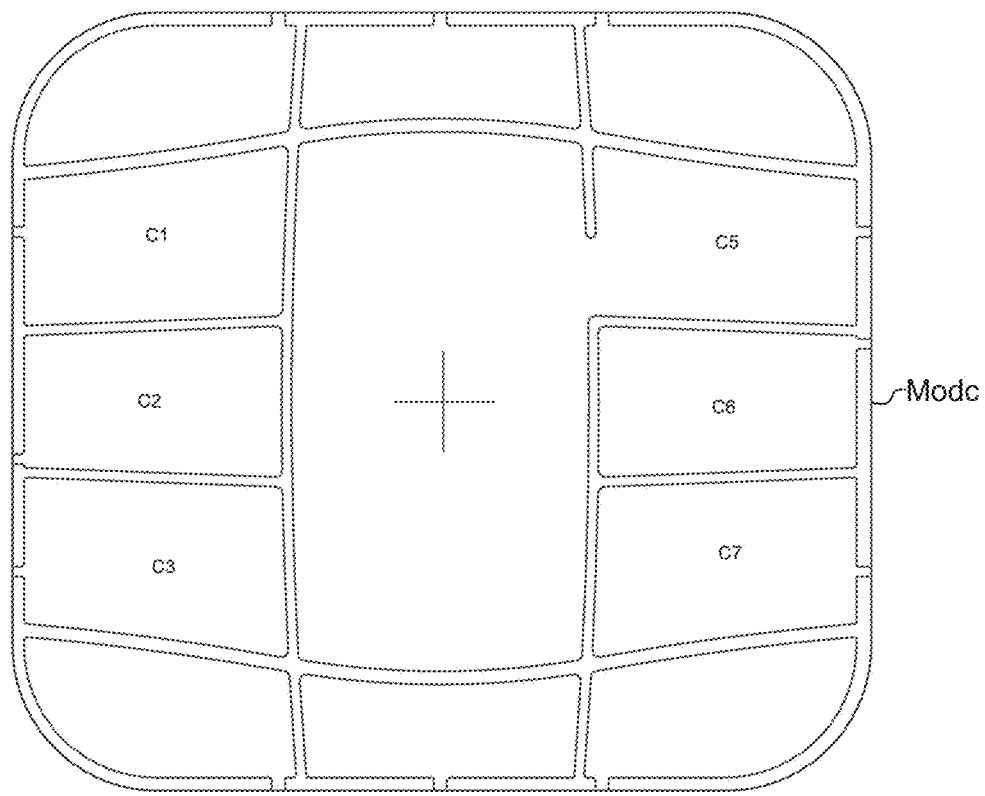
FIG. 1a shows a view of the top, also referred to as the contact face, of a conventional module for a contact application.
Figure 1B:
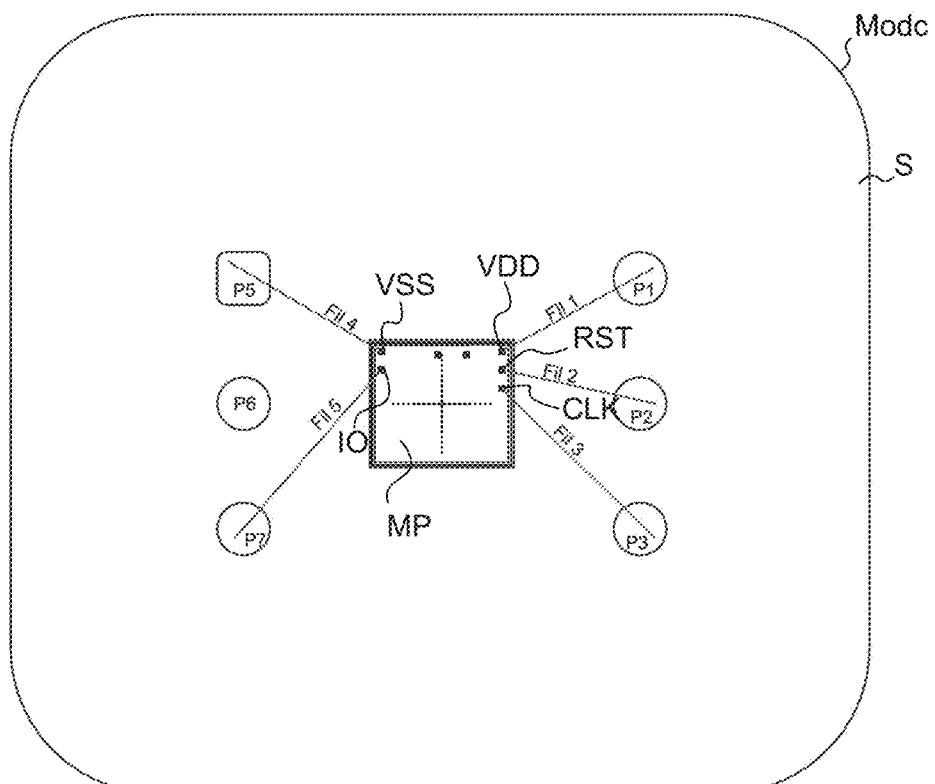

With reference to FIGS. 1a and 1b, the module Modc includes a thin, planar carrier S including, on what is referred to as an external face (FIG. 1a), six external electrical contact lands C1, C2, C3, C5, C6, C7 that are intended to cooperate through contact with contact zones of an external reader, and, on what is referred to as an internal face (FIG. 1b), a printed circuit primarily including wires Fil1, Fil2, Fil3, Fil4, Fil5 and a chip MP, various ports IO, VSS, VDD, RST, CLK of which are connected to the external contact lands via the printed circuit. In the example shown, the connections between the ports of the chip MP and the external electrical contact lands are further formed by means of wells P1, P2, P3, P5, P6, P7, i.e. holes in the carrier S through which the connecting wires are routed. Vias could also be used.

Of course, the number of external electrical contact lands and/or the number of useful ports of the chip may vary.

Thus, in the example of FIG. 1b, five wires Fil1, Fil2, Fil3, Fil4, Fil5, for example made of gold, connect the ports of the chip (Vdd, Vss, IO, CLK, RST) to the back face of five external electrical contact lands C1, C2, C3, C5, C7 via the wells P1, P2, P3, P5, P7.

Figure 2A:
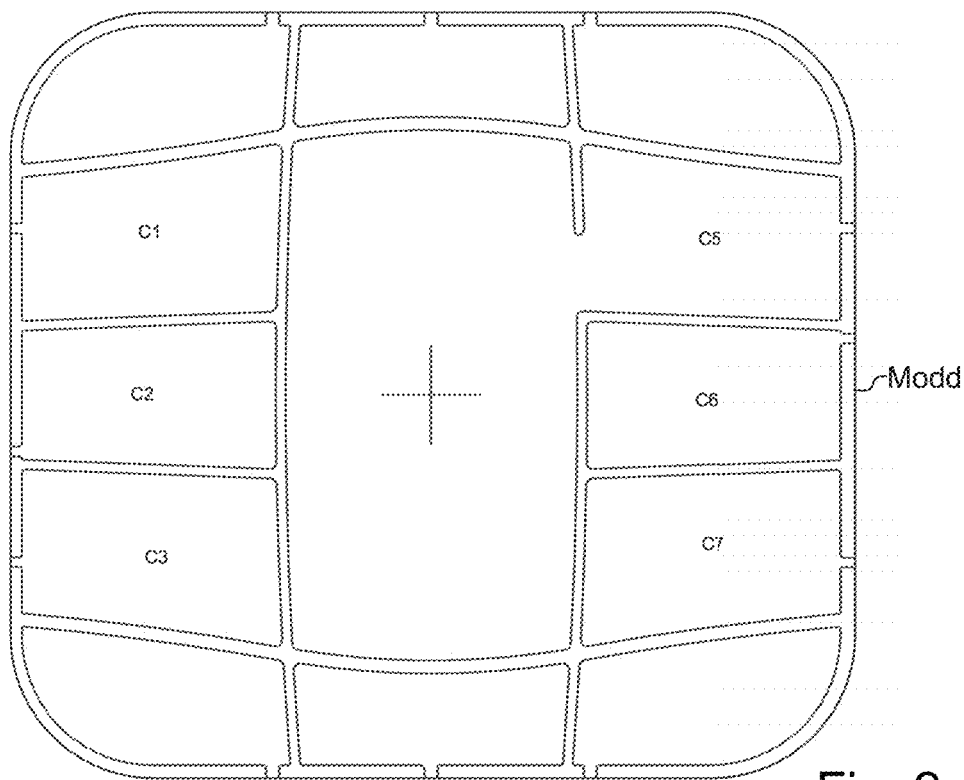
FIG. 2a shows a contact face of a conventional module for a contact or contactless application, i.e. for a dual application.
Figure 2B:
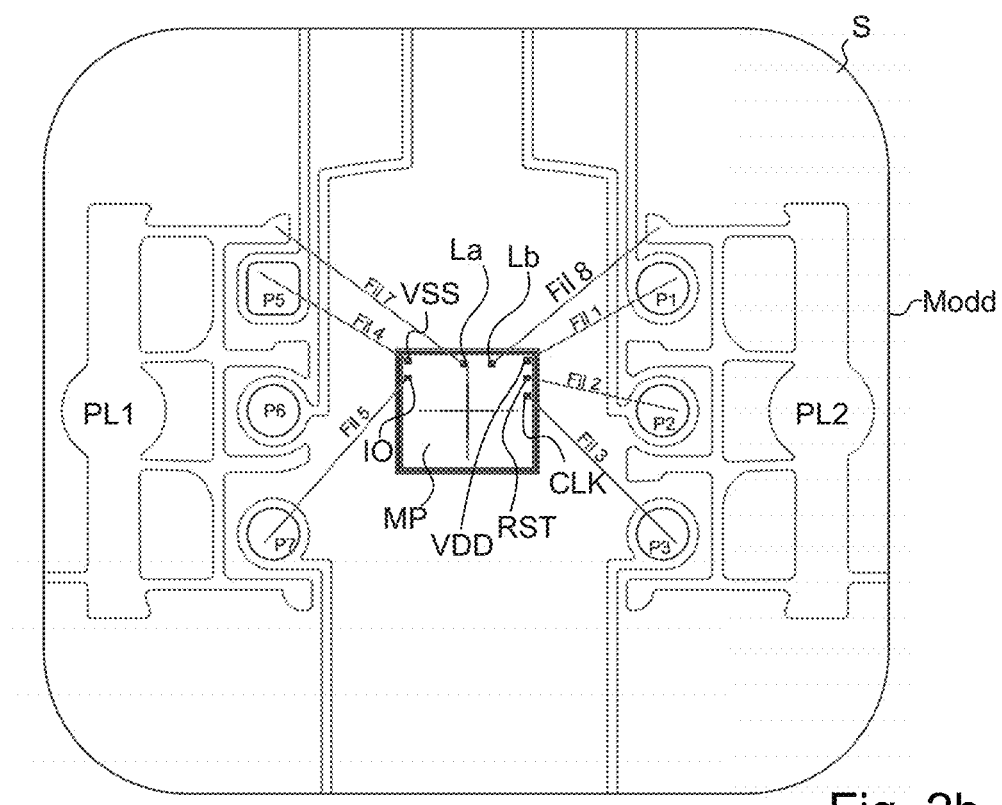

In FIGS. 2a and 2b, the module is a "dual" module Modd, i.e. it allows both contact and contactless operation. It differs from the module Modc shown in FIG. 1b in that its internal face (FIG. 2b) further includes two antenna pads PL1, PL2, which are configured to be connected to ends of an antenna L, inside the body (shown for example in FIGS. 13 to 16).

In the context of the illustrated example, two other wires Fil7, Fil8, for example made of gold, connect ports La, Lb of the chip to the antenna pads PL1, PL2, respectively.

However, modules such as those shown in FIGS. 1a, 1b, 2a and 2b may remain operational when they are separated from the body of the electronic document into which they were previously inserted.

To rectify this, the connection between one or more ports of the chip and one or more external electrical contact lands is made via an inlay inside the structure of the body of the corresponding electronic document, which inlay, described in conjunction with FIGS. 9 to 16, includes a connection land.

In the examples depicted here, the invention is shown, according to one embodiment, on the port IO, but it could of course be implemented on any one of the other ports (Vss, Vdd, RST, CLK) of the chip MP, or several ports, or even all of the ports.

FIG. 3 shows a first exemplary embodiment of the invention for a contact module Modc in which the connection between at least one of the ports of the chip, here the port IO, and the corresponding land, i.e. the land C7, is formed by two subcircuits, for example at least two wires instead of only one as in the example of FIG. 1b.

The module Modc thus includes an electrical circuit that includes both a first subcircuit configured to electrically connect the port IO of the chip MP to a connection land of the inlay and a second subcircuit configured to electrically connect the connection land of the inlay to the external electrical contact land C7 of the carrier S of the module Modc.

For example, the first subcircuit and the second subcircuit of the electrical circuit of the module each include a contact pad IO1p, IO2p, which are arranged at two distinct sites on the carrier and located close to the periphery of the carrier.

In the exemplary embodiment of FIG. 3, the contact pads IO1p, IO2p are juxtaposed but distinct such that no direct electrical contact is made between them without being connected to the connection land of the inlay.

Here, the first subcircuit includes, for example, at least one wire Fil5, for example made of gold, that is connected to the port IO of the chip MP, a track IO1e formed in the carrier S and the contact pad IO1p located on the periphery of the carrier S so as to face at least part of a connection land PFc, PCc, PFc1, PFc2, PCc1, PCc2 formed on the part of an inlay forming the spotface Cav1 (shown in FIGS. 9 to 16), the track IO1e electrically connecting the wire Fil5, at a connection point IOd, to the contact pad IO1p.

In other words, the wire Fil5 connected to the port IO is now no longer directly connected to the external electrical connection land C7 but to a connection point IOd, such that the connection is now made by the inlay.

The second subcircuit includes here, for example, a well P7 that is electrically connected to a back face of the external electrical connection land C7 of the external face of the carrier S, a ring IOr surrounding the well, to which it is connected by a wire Fil6, for example made of gold, a track IO2e formed in the carrier S and the contact pad IO2p located on the periphery of the carrier S so as to face at least part of the connection land formed on the part of the inlay forming the spotface Cav1, the track IO2e electrically connecting the ring IOr to the contact pad IO2p.

The track IO1e of the first subcircuit and/or the track IO2e of the second subcircuit formed in the carrier are for example etched, photoetched or printed.

Before the module Modc is added to an electronic document body, the contact pads IO1p, IO2p are at two different electrical potentials.

The exemplary embodiment of FIG. 4 differs from that of FIG. 3 in that the contact pad IO1p and the contact pad IO2p are no longer juxtaposed; in particular, they are arranged on either side of the chip MP.

Figure 5:
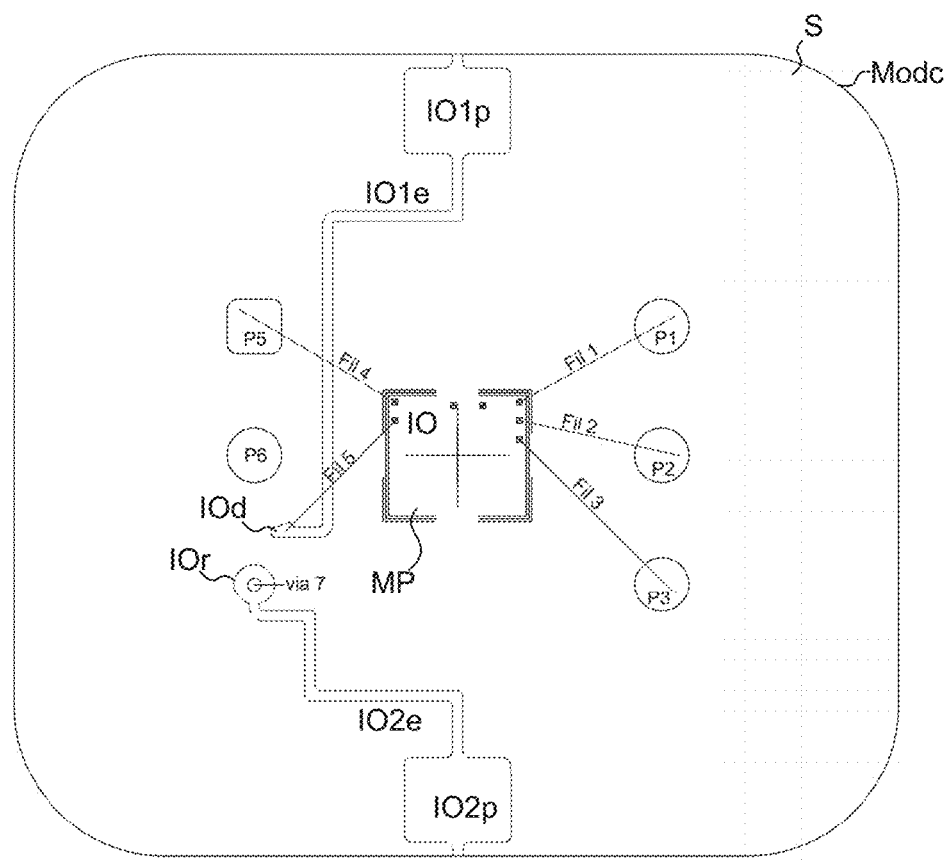

Lastly, the exemplary embodiment of FIG. 5 differs from that of FIG. 4 in that a via Via7 replaces the well P7 and the wire Fil6. In other words, any of the wells of FIG. 3 or 4 could be replaced by a via.

Figure 8:
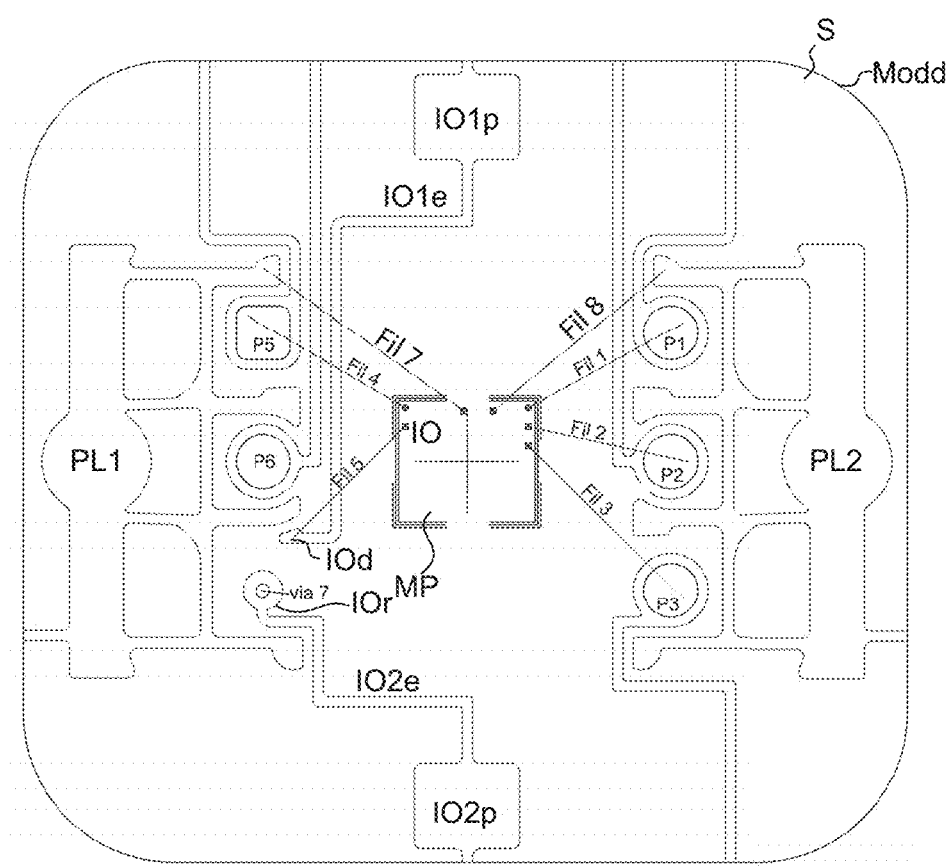

The modules Modd of FIGS. 6 to 8 respectively differ from the modules shown in FIGS. 3 to 5 in that the modules Modd of FIGS. 6 to 8 are configured for dual operation.

To this end, the internal face of the module Modd further includes two antenna pads PL1, PL2 that are configured to be connected to two connection lands PFd1, PFd2, PCd1, PCd2 of an antenna L of the inlay, the lands being formed on the part of the inlay that is configured to form the spotface Cav1 of the cavity of the body. Two other wires Fil7, Fil8, for example made of gold, connect ports La, Lb of the chip to the antenna pads PL1, PL2, respectively.

FIGS. 9 to 16 show an inlay (Yc, Yd) according to various exemplary embodiments of the invention, part of which is intended to form a spotface (Cav1) of a cavity formed in the body later on.

The inlay includes in particular a connection land (PFc, PCc, PFc1, PFc2, PCc1, PCc2) formed on the part that is intended to form the spotface (Cav1).

To make the connection via an inlay according to the invention, an inlay Yc is added in addition to the typical structures of contact electronic documents or an inlay Yd, typically present in "dual" operation electronic documents, is modified.

FIGS. 9 to 12 show an inlay Yc to be incorporated into a typical contact electronic document structure.

Thus, according to the invention, the inlay Yc generally includes a connection land that is located on part of the inlay that is configured to form a cavity spotface Cav1 when the inlay is added to an electronic document body.

These figures show that the connection land may, as needed:
consist of a single connection land PFc, PCc, as in FIGS. 9 and 10; or
include a first zone PFc1, PCc1 and a second zone PFc2, PCc2 that are distinct from one another, as in FIGS. 11 and 12.

Independently, the single connection land PFc, PCc, or at least one, or both, of the first zone PFc1, PCc1 and the second zone PFc2, PCc2, may be formed:
of a zigzag of wire as in FIGS. 9 and 11, for example a copper wire, also referred to as a "wire pad"; or
of a metal surface as in FIGS. 10 and 12, for example a copper surface, also referred to as a "copper pad".

In one embodiment in which the connection land includes a first zone PFc1, PCc1 and a second zone PFc2, PCc2 that are distinct from one another, as in FIGS. 11 and 12, these are then preferably connected by a wire fc, which is for example a copper wire, or a photoetched or printed track.

The wire fc is arranged in the inlay while bypassing the part of the inlay that is intended to form the spotface Cav1 of the cavity so as to bypass the cavity.

Before the cavity is formed, it is possible for another wire to connect the first zone PFc1, PCc1 and the second zone PFc2, PCc2 by passing through part of the inlay that is intended to be removed during a step of producing the deep part Cav2 of the cavity, for example by machining, for example such that this other wire is then cut, the zones then being connected only by the wire fc.

In the case of a dual-operation electronic document, the inlay Yd, shown in FIGS. 13 to 16, includes, in addition to the elements described above, an antenna L.

The antenna L includes two connection lands PFd1, PFd2, PCd1, PCd2.

Each of the two connection lands PFd1, PFd2, PCd1, PCd2 of the antenna L is formed on the part of the inlay forming the spotface Cav1 so as to be located facing one of the two antenna pads PL1, PL2 of the carrier S of the corresponding module and connected to one of these pads PL1, PL2 once the electronic document is assembled.

Like the connection land, at least one, or both, of the connection lands PFd1, PFd2, PCd1, PCd2 of the antenna L may be formed:
of a zigzag of wire as in FIGS. 13 and 15, for example a copper wire; or
of a metal surface as in FIGS. 14 and 16, for example a copper surface, also referred to as a "copper pad".

With the exception of its two connection lands, the antenna L is formed in the inlay outside its part forming the spotface.

In the exemplary embodiments of FIGS. 15 and 16, although the connection land includes a first zone PFc1, PCc1 and a second zone PFc2, PCc2 that are connected by a wire fc, this wire fc is possibly insulated, for example by a sheath, such that it is not electrically connected to the antenna L.

Likewise, before the cavity is formed, it is possible for other wires to connect the first zone PFc1, PCc1 to one of the connection lands PFd1, PFd2, PCd1, PCd2 of the antenna L, and the second zone PFc2, PCc2 to another of the connection lands PFd1, PFd2, PCd1, PCd2 of the antenna L, by passing through part of the inlay that is intended to be removed during a step of producing the deep part Cav2 of the cavity, for example by machining, for example such that these other wires are then cut, the first zone PFc1, PCc1 and the second zone PFc2, PCc2 then being connected only by the wire fc, and insulated from the antenna L.

Lastly, FIGS. 17 to 20 show examples of the assembly of a module Modc, Modd such as described above with an inlay Yc, Yd such as described above.

However, in these figures, the module is shown as if it were transparent, since it is flipped over to be added to the body.

Moreover, for the sake of conciseness, only those examples with an inlay Yc, Yd in which the various connection lands are formed by a zigzag of wire are shown, even though, of course, at least one, or even all, of the connection lands of the inlay Yc, Yd could be formed by a metal surface.

According to one preferred example of the invention, the electronic document includes a body that includes a cavity hollowed out of part of a thickness of the body, the cavity (illustrated in FIGS. 17 to 20) including a deep central portion Cav2 and a peripheral portion formed of a spotface Cav1, which peripheral portion is less deep than the central portion and surrounds the central portion.

According to the invention, the spotface is formed by part of the inlay Yc, Yd that includes the connection land PFc, PCc, PFc1, PFc2, PCc1, PCc2, or even two connection lands PFd1, PFd2 (or PCd1, PCd2; not shown) of the antenna L, the inlay further including the antenna L, if applicable.

When the module Modc, Modd is inserted into the cavity, the external face of the carrier S is flush with the outer face of the body of the electronic document; the chip, which is generally encapsulated in a resin, is housed in the deep portion of the cavity Cav2, while the part of the internal face of the carrier bearing the contact pads IO1p, IO2p and, optionally, the two antenna pads PL1, PL2 (as shown in FIGS. 19 and 20), is positioned facing the spotface Cav1 of the cavity.

To achieve this, the module is for example placed in the cavity according to a connection technique using an ACF (anisotropic conductive film), which deforms and forms the contact.

Thus, the contact pad IO1p of the first subcircuit and the contact pad IO2p of the second subcircuit respectively face at least part of the connection land formed on the part of the inlay forming the spotface.

For example, as shown in FIG. 17, the contact pad IO1p of the first subcircuit and the contact pad IO2p of the second subcircuit both face the single connection land PFc (PCc; not shown) of the inlay.

The contact pads IO1p and IO2p are then at the same electrical potential.

The port IO is now electrically connected to the corresponding external electrical contact land C7.

As shown in FIG. 18, the contact pad IO1p of the first subcircuit faces the first zone PFc1 (PCc1; not shown) of the connection land of the inlay and the contact pad IO2p of the second subcircuit faces the second zone PFc2 (PCc2; not shown) of the connection land of the inlay, the first zone PFc1 (PCc1) and the second zone PFc2 (PCc2) being connected by the wire fc, which bypasses the cavity.

The modules Modd and inlays Yd of FIGS. 19 and 20 respectively correspond to the modules Modc and inlays Yc of FIGS. 17 and 18, which further include, respectively, antenna pads PL1, PL2 and an antenna L that is provided with two connection lands PFd1, PFd2 (or PCd1, PCd2; not shown); the antenna pad PL1 then facing the connection land PFd1 of the antenna L and the antenna pad PL2 then facing the connection land PFd2 of the antenna L.

Thus, the ports La and Lb of the chip MP are connected to the antenna L of the inlay Yd.

Thus, in such an electronic document, detaching the module from the body in any way renders the module inoperative.

The invention claimed is:

1. Electronic document including:
   a body, which includes a cavity hollowed out of part of a thickness of the body, the cavity including a deep central portion (Cav2) and a peripheral portion formed of a spotface (Cav1), which peripheral portion is less deep than the central portion and surrounds the central portion;
   a module (Modc, Modd), inserted into the cavity, including:
      a carrier (S) having what is referred to as an external face, which bears at least one external electrical contact land (C1, C2, C3, C5, C6, C7), and what is referred to as an internal face, opposite the external face; and
      a chip (MP), attached on the internal face side of the carrier, including at least one port (Vdd, Vss, IO, CLK, RST); and
   wherein: the body includes an inlay (Yc, Yd), a part of which forms the spotface (Cav1) of the cavity, and which includes a connection land (PFc, PCc, PFc1, PFc2, PCc1, PCc2) formed on the part forming the spotface (Cav1);
   and wherein the module includes an electrical circuit that includes both a first subcircuit configured to electrically connect the port (IO) of the chip (MP) to the connection land (PFc, PCc, PFc1, PFc2, PCc1, PCc2) of the inlay and a second subcircuit configured to electrically connect the connection land (PFc, PCc, PFc1, PFc2, PCc1, PCc2) of the inlay to the external electrical contact land (C7) of the carrier (S) of the module (Modc, Modd), the electrical connection between the chip and the external electrical contact land being broken, rendering the module inoperative, if the module is separated from the body.

2. The electronic document according to claim 1, wherein the connection land (PFc, PCc, PFc1, PFc2, PCc1, PCc2) of the inlay consists of a single connection land (PFc, PCc); and wherein the single land consists of a zigzag of wire (PFc) or of a metal surface (PCc).

3. The electronic document according to claim 1, wherein the connection land (PFc, PCc, PFc1, PFc2, PCc1, PCc2) includes a first zone (PFc1, PCc1) and a second zone (PFc2, PCc2) that is distinct from the first zone, the first zone (PFc1, PCc1) being electrically connected to the second zone (PFc2, PCc2) by a wire (fc) formed in the inlay and bypassing the cavity, at least one of the first and the second zones consisting of a zigzag of wire (PFc1, PFc2) or of a metal surface (PCc1, PCc2).

4. The electronic document according to claim 1, wherein the second subcircuit includes a via (Via7) or a well (P7) that is electrically connected to a back face of the external electrical connection land (C7) of the external face of the carrier (S), a ring (IOr) surrounding the via (Vial) or the well (P7), a track (IO2e) formed in the carrier (S) and a contact pad (IO2p) located facing at least part of the connection land (PFc, PCc, PFc1, PFc2, PCc1, PCc2) formed on the part of the inlay forming the spotface (Cav1), the track (IO2e) electrically connecting the ring (IOr) to the contact pad (IO2p).

5. The electronic document according to claim 1, wherein the first subcircuit includes at least one wire (Fil5) that is connected to the port (IO) of the chip, a track (IO1e) formed in the carrier (S) and a contact pad (IO1p) located facing at least part of the connection land (PFc, PCc, PFc1, PFc2, PCc1, PCc2) formed on the part of the inlay forming the spotface (Cav1), the track (IO1e) electrically connecting the wire (Fil5) to the contact pad (IO1p).

6. The electronic document according to claim 1, wherein the carrier (S) of the module further includes two antenna pads (PL1, PL2), which are connected to two corresponding ports (La, Lb) of the chip (MP), respectively, and wherein the inlay of the body includes an antenna (L) that includes two connection lands (PFd1, PFd2, PCd1, PCd2), each of the two connection lands (PFd1, PFd2, PCd1, PCd2) of the antenna (L) being formed on the part of the inlay forming the spotface (Cav1) and being located facing one of the two antenna pads (PL1, PL2) of the carrier (S) of the module and connected to one of these pads (PL1, PL2).

7. The electronic document according to claim 2, wherein the second subcircuit includes a via (Via7) or a well (P7) that is electrically connected to a back face of the external electrical connection land (C7) of the external face of the carrier (S), a ring (IOr) surrounding the via (Via7) or the well (P7), a track (IO2e) formed in the carrier (S) and a contact pad (IO2p) located facing at least part of the connection land (PFc, PCc, PFc1, PFc2, PCc1, PCc2) formed on the part of the inlay forming the spotface (Cav1), the track (IO2e) electrically connecting the ring (IOr) to the contact pad (IO2p).

8. The electronic document according to claim 3, wherein the second subcircuit includes a via (Via7) or a well (P7) that is electrically connected to a back face of the external electrical connection land (C7) of the external face of the carrier (S), a ring (IOr) surrounding the via (Via7) or the well (P7), a track (IO2e) formed in the carrier (S) and a contact pad (IO2p) located facing at least part of the connection land (PFc, PCc, PFc1, PFc2, PCc1, PCc2) formed on the part of the inlay forming the spotface (Cav1), the track (IO2e) electrically connecting the ring (IOr) to the contact pad (IO2p).

9. The electronic document according to claim 2, wherein the first subcircuit includes at least one wire (Fil5) that is connected to the port (IO) of the chip, a track (IO1e) formed in the carrier (S) and a contact pad (IO1p) located facing at least part of the connection land (PFc, PCc, PFc1, PFc2, PCc1, PCc2) formed on the part of the inlay forming the spotface (Cav1), the track (IO1e) electrically connecting the wire (Fil5) to the contact pad (IO1p).

10. The electronic document according to claim 3, wherein the first subcircuit includes at least one wire (Fil5) that is connected to the port (IO) of the chip, a track (IO1e) formed in the carrier (S) and a contact pad (IO1p) located facing at least part of the connection land (PFc, PCc, PFc1, PFc2, PCc1, PCc2) formed on the part of the inlay forming the spotface (Cav1), the track (IO1e) electrically connecting the wire (Fil5) to the contact pad (IO1p).

11. The electronic document according to claim 4, wherein the first subcircuit includes at least one wire (Fil5) that is connected to the port (IO) of the chip, a track (IO1e) formed in the carrier (S) and a contact pad (IO1p) located facing at least part of the connection land (PFc, PCc, PFc1, PFc2, PCc1, PCc2) formed on the part of the inlay forming the spotface (Cav1), the track (IO1e) electrically connecting the wire (Fil5) to the contact pad (IO1p).

12. The electronic document according to claim 7, wherein the first subcircuit includes at least one wire (Fil5) that is connected to the port (IO) of the chip, a track (IO1e) formed in the carrier (S) and a contact pad (IO1p) located facing at least part of the connection land (PFc, PCc, PFc1, PFc2, PCc1, PCc2) formed on the part of the inlay forming the spotface (Cav1), the track (IO1e) electrically connecting the wire (Fil5) to the contact pad (IO1p).

13. The electronic document according to claim 8, wherein the first subcircuit includes at least one wire (Fil5) that is connected to the port (IO) of the chip, a track (IO1e) formed in the carrier (S) and a contact pad (IO1p) located facing at least part of the connection land (PFc, PCc, PFc1, PFc2, PCc1, PCc2) formed on the part of the inlay forming the spotface (Cav1), the track (IO1e) electrically connecting the wire (Fil5) to the contact pad (IO1p).

14. The electronic document according to claim 2, wherein the carrier (S) of the module further includes two antenna pads (PL1, PL2), which are connected to two corresponding ports (La, Lb) of the chip (MP), respectively, and wherein the inlay of the body includes an antenna (L) that includes two connection lands (PFd1, PFd2, PCd1, PCd2), each of the two connection lands (PFd1, PFd2, PCd1, PCd2) of the antenna (L) being formed on the part of the inlay forming the spotface (Cav1) and being located facing one of the two antenna pads (PL1, PL2) of the carrier (S) of the module and connected to one of these pads (PL1, PL2).

15. The electronic document according to claim 3, wherein the carrier (S) of the module further includes two antenna pads (PL1, PL2), which are connected to two corresponding ports (La, Lb) of the chip (MP), respectively, and wherein the inlay of the body includes an antenna (L) that includes two connection lands (PFd1, PFd2, PCd1, PCd2), each of the two connection lands (PFd1, PFd2, PCd1, PCd2) of the antenna (L) being formed on the part of the inlay forming the spotface (Cav1) and being located facing one of the two antenna pads (PL1, PL2) of the carrier (S) of the module and connected to one of these pads (PL1, PL2).

16. The electronic document according to claim 4, wherein the carrier (S) of the module further includes two antenna pads (PL1, PL2), which are connected to two corresponding ports (La, Lb) of the chip (MP), respectively, and wherein the inlay of the body includes an antenna (L) that includes two connection lands (PFd1, PFd2, PCd1, PCd2), each of the two connection lands (PFd1, PFd2, PCd1, PCd2) of the antenna (L) being formed on the part of the inlay forming the spotface (Cav1) and being located facing one of the two antenna pads (PL1, PL2) of the carrier (S) of the module and connected to one of these pads (PL1, PL2).

17. The electronic document according to claim 5, wherein the carrier (S) of the module further includes two antenna pads (PL1, PL2), which are connected to two corresponding ports (La, Lb) of the chip (MP), respectively, and wherein the inlay of the body includes an antenna (L) that includes two connection lands (PFd1, PFd2, PCd1, PCd2), each of the two connection lands (PFd1, PFd2, PCd1, PCd2) of the antenna (L) being formed on the part of the inlay forming the spotface (Cav1) and being located facing one of the two antenna pads (PL1, PL2) of the carrier (S) of the module and connected to one of these pads (PL1, PL2).

18. The electronic document according to claim 7, wherein the carrier (S) of the module further includes two antenna pads (PL1, PL2), which are connected to two corresponding ports (La, Lb) of the chip (MP), respectively, and wherein the inlay of the body includes an antenna (L) that includes two connection lands (PFd1, PFd2, PCd1, PCd2), each of the two connection lands (PFd1, PFd2, PCd1, PCd2) of the antenna (L) being formed on the part of the inlay forming the spotface (Cav1) and being located facing one of the two antenna pads (PL1, PL2) of the carrier (S) of the module and connected to one of these pads (PL1, PL2).

19. The electronic document according to claim 8, wherein the carrier (S) of the module further includes two antenna pads (PL1, PL2), which are connected to two corresponding ports (La, Lb) of the chip (MP), respectively, and wherein the inlay of the body includes an antenna (L) that includes two connection lands (PFd1, PFd2, PCd1, PCd2), each of the two connection lands (PFd1, PFd2, PCd1, PCd2) of the antenna (L) being formed on the part of the inlay forming the spotface (Cav1) and being located facing one of the two antenna pads (PL1, PL2) of the carrier (S) of the module and connected to one of these pads (PL1, PL2).

20. The electronic document according to claim 9, wherein the carrier (S) of the module further includes two antenna pads (PL1, PL2), which are connected to two corresponding ports (La, Lb) of the chip (MP), respectively, and wherein the inlay of the body includes an antenna (L) that includes two connection lands (PFd1, PFd2, PCd1, PCd2), each of the two connection lands (PFd1, PFd2, PCd1, PCd2) of the antenna (L) being formed on the part of the inlay forming the spotface (Cav1) and being located facing one of the two antenna pads (PL1, PL2) of the carrier (S) of the module and connected to one of these pads (PL1, PL2).

\* \* \* \* \*